United States Patent [19]

Ogisu

[11] Patent Number: 4,584,965
[45] Date of Patent: Apr. 29, 1986

[54] PLASMA TREATING APPARATUS

[75] Inventor: Yasuhiko Ogisu, Aichi, Japan

[73] Assignee: Toyoda Gosei Co., Ltd., Nishikasugai, Japan

[21] Appl. No.: 680,511

[22] Filed: Dec. 11, 1984

[30] Foreign Application Priority Data

Dec. 15, 1983 [JP] Japan ................ 58-236546

[51] Int. Cl.$^4$ ............................ C23C 16/00
[52] U.S. Cl. ..................... 118/730; 118/732
[58] Field of Search ................. 118/730, 732

[56] References Cited

U.S. PATENT DOCUMENTS 4,365,587 12/1982 Hirose et al. ............ 118/719 X
4,397,885 8/1983 Akai et al. ................. 427/38

Primary Examiner—James R. Hoffman
Attorney, Agent, or Firm—Cushman, Darby & Cushman

[57] ABSTRACT

Herein disclosed is a plasma treating apparatus for treating articles such as bumpers of synthetic resins with a plasma gas to activate the surfaces of said articles before the same are painted. The plasma treating apparatus comprises: a body defining a chamber for accommodating said articles; a plasma injection pipe disposed in said accommodating chamber for injecting the plasma gas onto the surfaces of said articles; a pair of rotatable supporting members juxtaposed in said accommodating chamber to each other and made rotatable on an axis; and a plurality of supporting beds supported between said rotatable supporting members for supporting said articles.

7 Claims, 6 Drawing Figures

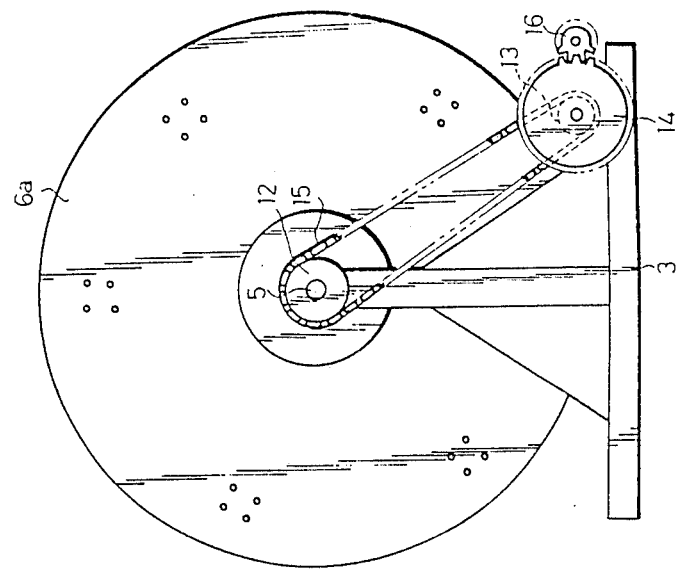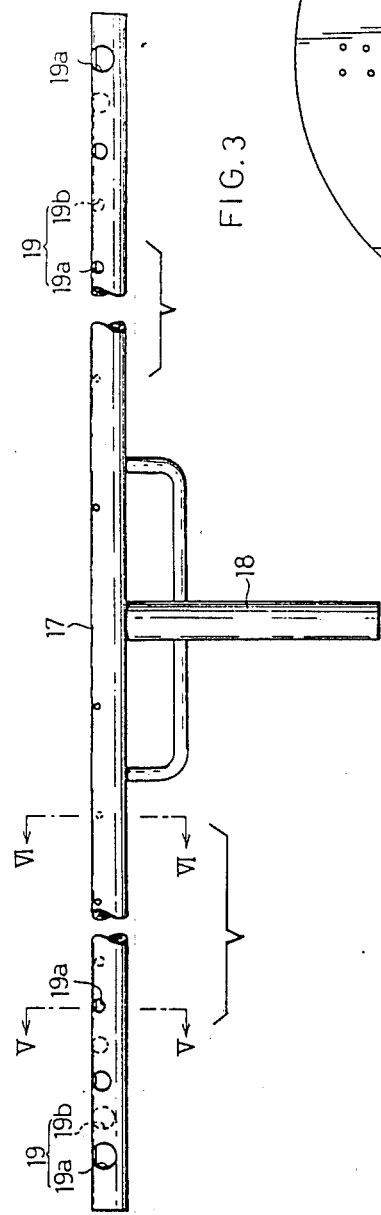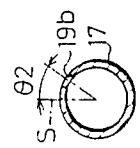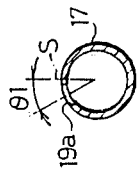

PLASMA TREATING APPARATUS

BACKGROUND OF THE INVENTION

1. Field of the Invention

The present invention relates to a plasma treating apparatus for treating the surfaces of articles such as bumpers of plastic resins with a plasma gas.

2. Description of the Prior Art

In the plasma treating apparatus of the above-specified kind, according to the prior art, automotive parts made of polypropylene such as synthetic resin bumpers, are arranged laminally in juxtaposition to one another in a sealed accommodating chamber, in which plasma injection pipes are accommodated, so that a plasma gas such as oxygen is injected from the injection pipe onto the surfaces of the bumpers to activate the bumper surfaces so as to make it liable for paint to be caught by the bumper surfaces.

In this conventional apparatus, however, since the bumpers are held still in the accommodating chamber and since the paired plasma injection pipes are arranged diagonally in juxtaposition to each other, there arise problems that it is troublesome to control, inspect and maintain plasma supply means to be connected with the respective injection pipes and that a cost for fasilities is raised.

SUMMARY OF THE INVENTION

The present invention has been conceived to eliminate the aforementioned defects and has an object to provide a novel plasma treating apparatus which is enabled to facilitate the control, inspection and maintenance of plasma supply means to be connected with an injection pipe, to produce the apparatus as a whole at a reasonable cost, and to inject a plasma gas uniformly onto bumpers.

In order to achieve this object, according to the present invention, one plasma injection pipe is provided, and there are disposed in an accommodating chamber a pair of rotatable supporting members which are made rotatable on one axis and between which is supported at least one supporting bed for placing thereon articles to be painted.

Other objects of the present invention will become apparent if an embodiment thereof to be described is understood and will be clarified in the appended claims. A number of advantages left untouched herein will occur to those skilled in the art if the present invention is practised.

BRIEF DESCRIPTION OF THE DRAWINGS

FIG. 3 is a side elevation showing the plasma treating apparatus;

FIG. 4 is a front elevation showing a plasma injection pipe with its portion being omitted;

FIG. 5 is a section taken along line V—V of FIG. 4; and

FIG. 6 is a section taken along line VI—VI of FIG. 4.

DETAILED DESCRIPTION OF THE PREFERRED EMBODIMENT

Figure 2:
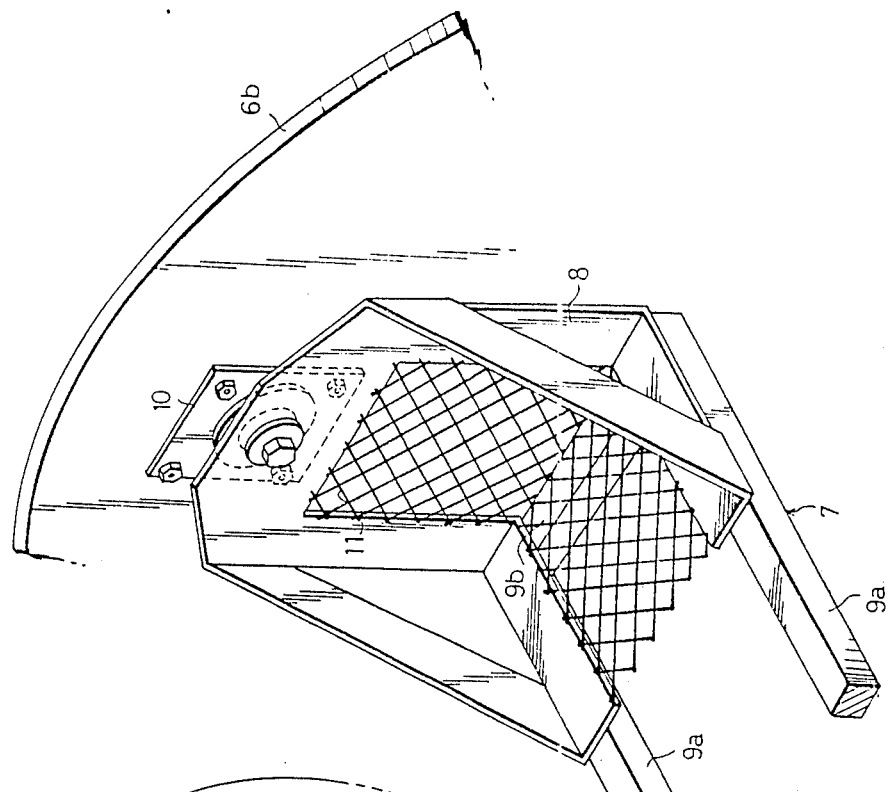
FIG. 2 is an enlarged perspective view showing a portion of a supporting bed of the plasma treating apparatus.

The present invention will be described in the following in connection with one embodiment thereof with reference to the accompanying drawings. A body 1 defining a sealed accommodating chamber of a plasma treating apparatus is formed into a hollow cylindrical shape and has its lefthand wall equipped with a (not-shown) door, which can open or close the accommodating chamber, and its righthand wall formed with a plasma discharge port 2 in its upper portion. In the body 1, there is placed a rectangular frame 3 having two right and left sides, from which a pair of posts 4 are errected to face each other.

Between the upper end portions of the two posts 4, there is rotatably borne a spindle 5 having two ends, on which a pair of supporting disks 6a and 6b are mounted such that they can rotate together. Between the inner faces of those two supporting disks 6a and 6b, there are arranged at a predetermined angular spacing six supporting beds 7 for placing thereon bumpers B made of a synthetic resin such as polypropylene.

As better seen from FIG. 2, each supporting bed 7 is constructed of a pair of supporting brackets 8 each made by bending a metal sheet, a pair of lying bars 9a mounted between the two supporting brackets 8, and a cross bar 9b arranged below the end portions of the two supporting brackets 8 in a manner to connect the end portion of the two lying bars 9a. Each of the supporting brackets 8 has its upper end portion hinged to the corresponding one of the supporting disks 6a and 6b by means of a fixture 10 such that it can swing relative thereto. As a result, each supporting bed 7 is held in a horizontal position when the spindle 5 and the supporting disks 6a and 6b either rotate or stand still. Moreover, each supporting member 8 has its central portion cut away and has a net 11 extending under tension in its cut-away portion for allowing the plasma gas to pass therethrough.

Turning now to FIG. 3, a sprocket 12 is fitted at the left end portion of the aforementioned spindle 5, and a sprocket 13 and an intermediate gear 14 are so borne on the aforementioned frame 3 as to rotate on a common axis. A chain 15 is made to run on the two sprockets 12 and 13, and a drive gear 16 driven rotationally by a not-shown drive motor is in meshing engagement with the aforementioned intermediate gear 14.

In accordance with the rotations of the drive gear 16, moreover, the supporting disks 6a and 6b are rotated together with the spindle 5 through the intermediate gear 14, the sprocket 13, the chain 15 and the sprocket 12.

Figure 1:
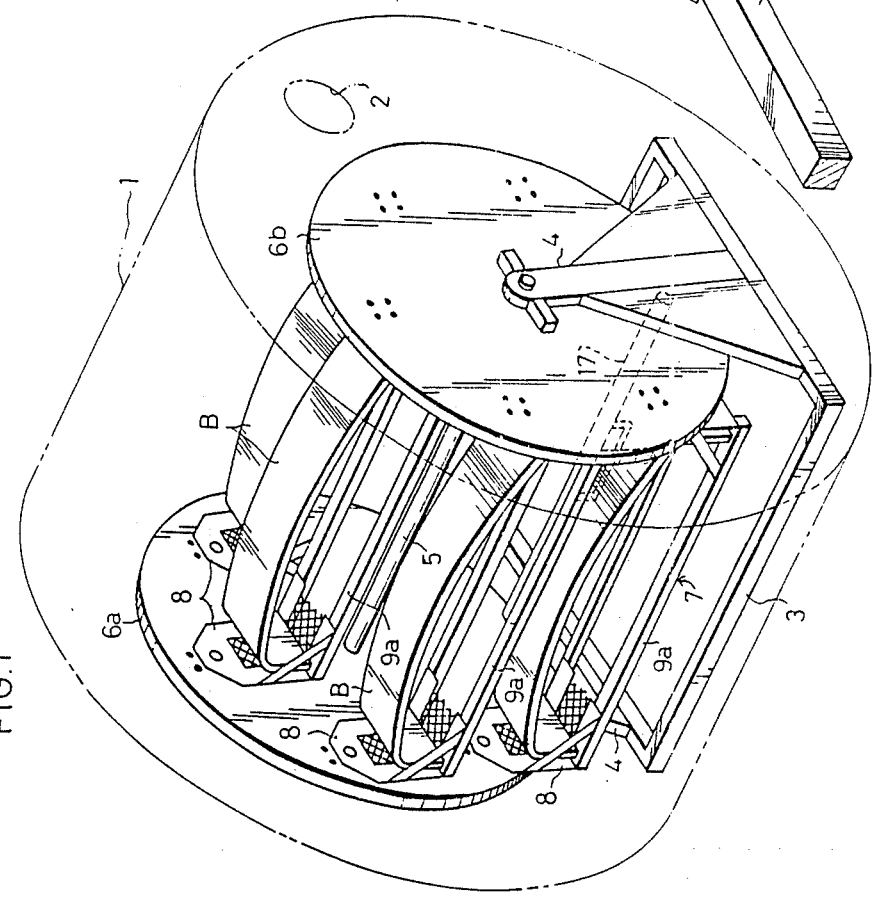
FIG. 1 is a perspective view showing a plasma treating apparatus embodying the present invention.

Reverting to FIG. 1, there is accommodated in the body 1 below the aforementioned frame 3 one injection pipe 17 of stainless steel for injecting the plasma gas such as oxygen. With the (not-shown) plasma inlet which is formed generally at the center of the injection pipe 17, as shown in FIG. 4, there is connected an inlet pipe 18 which has its other end portion connected with (not-shown) plasma supply means outside of the body 1. The injection pipe 17 is formed in its outer circumference at both the sides of the inlet port with a number of injection ports 19 which are arranged such that their spacings are gradually decreased toward the end portions of the injection pipe 17 but that their diameters are gradually increased toward the same. Moreover, the injection ports 19 are composed of those 19a, which are opened at an inclination of a predetermined angle θ1 (e.g., 30 degrees in the present embodiment) in the leading direction circumferentially of the injection pipe 17 with respect to a vertical plane S, and the others which are opened at an inclination of a predetermined angle θ2 (e.g., 30 degrees in the present embodiment) in the trailing direction. Still moreover, the injection ports 19a inclined in the leading direction and the injection ports 19b inclined in the trailing direction are arranged alternately of each other. Furthermore, the number of the injection ports at the side of the discharge port 2 from the inlet pipe 18, i.e., at the righthand side is set to be 15% as small as that of the injection ports at the lefthand side.

As a result, when the drive motor is energized with the bumpers B placed on the respective supporting beds 7 in the body 1, the spindle 5 and the supporting discs 6a and 6b are rotated through the drive gear 16, the intermediate gear 14, the sprocket 13, the chain 15 and the sprocket 12, and the respective supporting beds 7 have their upper end portions hinged to the respective supporting disks 6a and 6b so that they are made rotatable together with the bumpers B relative to the supporting disks 6a and 6b, whereby the respective bumpers B are held in horizontal positions even while the supporting disks 6a and 6b are being rotated.

If the plasma gas such as oxygen is introduced through the inlet pipe 18 into the injection pipe 17, moreover, it is uniformly injected from the respective injection ports 19. As a result, the bumpers have their surfaces activated so that they can be painted without any difficulty.

In the present embodiment, moreover, since the net 11 is extended on each of the supporting brackets 8 and since the plasma gas is agitated by the rotations of each of the supporting beds 7, even articles having complicated shapes to be painted can have their complicated surfaces activated to any point with the plasma gas passing through the nets 11. Thanks to the provision of only one injection pipe 17, moreover, it is possible to control, inspect and maintain the plasma supply means which is connected with that single injection pipe 17, and to produce the apparatus as a whole at a reasonable cost.

As has been described in detail hereinbefore, the present invention can enjoy excellent advantages that the control, inspection and maintenance of the plasma supply means connected with the injection pipe can be conducted without difficulty, that the apparatus as a whole can be produced at a reasonable cost, and that the plasma gas can be uniformly injected onto the articles such as the bumpers.

It is apparent that widely different modifications can be constructed without departing from the spirit and scope of the present invention. Therefore, the present invention should not be restricted to the specific embodiments except it is defined by the appended claims.

What is claimed is:

1. A plasma treating apparatus for treating articles such as bumpers of synthetic resins with a plasma gas to activate the surfaces of said articles before the same are painted, comprising:
    (a) a body defining a chamber for accommodating said articles;
    (b) a plasma injection pipe disposed in said accommodating chamber for injecting the plasma gas onto the surfaces of said articles;
    (c) a pair of rotatable supporting members juxtaposed in said accommodating chamber to each other and made rotatable on an axis; and
    (d) at least one supporting bed supported between said rotatable supporting members for supporting said articles.

2. A plasma treating apparatus according to claim 1, wherein said plasma injection pipe extends in a lower portion of and in the axial direction of said accommodating chamber and is formed with a multiplicity of injection ports in the circumferential wall thereof.

3. A plasma treating apparatus according to claim 2, wherein said multiple injection ports are so positioned at both the sides of the longitudinal central portion of said plasma injection pipe that their spacings are gradually decreased toward the end portions of said injection pipe and that their diameters are gradually increased toward the same.

4. A plasma treating apparatus according to claim 3, wherein said multiple injection ports are composed of those, which are opened at an inclination of a predetermined angle made in one direction circumferentially of said injection pipe with respect to the vertical plane of said injection pipe, and the others which are opened at an inclination of a predetermined angle made in the other direction such that said port components are arranged alternately of each other.

5. A plasma treating apparatus according to claim 1, wherein a plurality of supporting beds are provided to extend horizontally for holding said articles in horizontal positions at all times independently of the rotations of said rotatable supporting members.

6. A plasma treating apparatus according to claim 5, wherein each of said supporting beds includes: a pair of supporting brackets hinged to said rotatable supporting members, a pair of lying bars extending between said supporting brackets, and a cross bar attached to each of said supporting brackets and connecting the end portions of said lying bars.

7. A plasma treating apparatus according to claim 6, wherein each of said supporting brackets has its central portion cut away and a net extended under tension over the cut-away portion for allowing the plasma gas to pass therethrough.

* * * * *